April 7, 1970 ERIC-ANDRE VITTOZ 3,505,536

FREQUENCY DIVIDING CIRCUIT, WITH SEMICONDUCTORS

Filed Feb. 3, 1967 3 Sheets-Sheet 1

April 7, 1970 ERIC-ANDRE VITTOZ 3,505,536

FREQUENCY DIVIDING CIRCUIT, WITH SEMICONDUCTORS

Filed Feb. 3, 1967 3 Sheets-Sheet 2

United States Patent Office 3,505,536
Patented Apr. 7, 1970

3,505,536

FREQUENCY DIVIDING CIRCUIT, WITH SEMICONDUCTORS

Eric-Andre Vittoz, Hauterive, Switzerland, assignor to Centre Electronique Horloger S.A., Neuchatel, Switzerland Filed Feb. 3, 1967, Ser. No. 613,937
Int. Cl. H03k *21/04*
U.S. Cl. 307—225 1 Claim

ABSTRACT OF THE DISCLOSURE

A frequency dividing circuit comprises a source of periodic input signals whose frequency is to be divided, a semiconductor switch means, a condenser, and an unstable multivibrator. The frequency of the output signal of the multivibrator is variable under the control of a voltage existing at the terminals of the condenser. The terminals of the condenser are periodically connected to the terminals of the source of the periodic input signals by the closing of the semiconductor switch means which is closed in synchronism with the output signal of the unstable multivibrator. Thus, the frequency of the output signal is brought under the control of a submultiple of the frequency to be divided.

The present invention has for object a frequency dividing circuit, with semiconductors.

Frequency dividing circuits are already known in which the phase of a variable frequency oscillator is brought under control.

The purpose of the invention is the realization of such a circuit working under low power and capable of being produced in the form of an integrated circuit.

The circuit according to the invention is characterized in that it comprises an unstable multivibrator the output signal frequency of which is variable under the control of a voltage existing at the terminals of a condenser, which is branched periodically and for a short moment to the terminals of the source of the periodic signal the frequency of which must be divided, by the closing of an electronic circuit-breaker controlled in synchronism with said output signal, the whole so as to bring the frequency of this output signal under control cf a sub-multiple of the frequency to be divided.

The accompanying drawing shows, by way of example, four embodiments of the circuit object of the invention.

Figure 1:
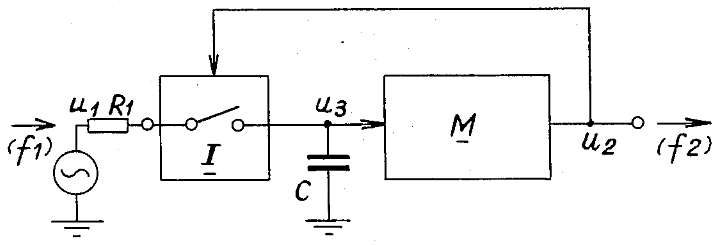
FIG. 1 is a general diagram of the circuit.

The circuit shown in FIG. 1 comprises an unstable multivibrator M producing a periodic signal $u_2$. The frequency $F_2$ of this signal is adjustable by an adjusting voltage $u_3$ memorized in a capacity C.

An electronic circuit-breaker I, which is closed at each period of the signal $u_2$ for a short moment, applies the source of the periodic input signal $u_1$, of frequency $F_1$ and internal resistance $R_1$, to the terminals of the capacity C. This has for effect to charge the latter to a voltage $u_3$ depending upon the relative phase of the signals $u_1$ and $u_2$. In other words, in equilibrium, the voltage $u_3$ is equal to the value of $u_1$ at the moments when the signal $u_2$ passes a well determined phase, in the case shown in FIG. 2, at the moments when the commutation of the multivibrator changes from one state to the other. The middle part of FIG. 2 indicates the position of the circuit-breaker I. At Q, one has the open position and at F, the closed position. In the three parts of this FIG. 2, *t* designates the time axis.

If the circuit is suitably dimensioned, it is possible to put the output frequency $F_2$ into step with a sub-multiple of the input frequency $F_1$. The two frequencies remain in step if one slowly varies the frequency $F_1$ between certain limits. As a matter of fact, a variation of $F_1$ produces a variation of the relative phase of the signals $u_1$ and $u_2$, thus a variation of the adjusting signal $u_3$. This latter acts on the frequency $F_2$ of the signal $u_2$, so that $F_2$ follows the variations of $F_1$.

Figure 2:
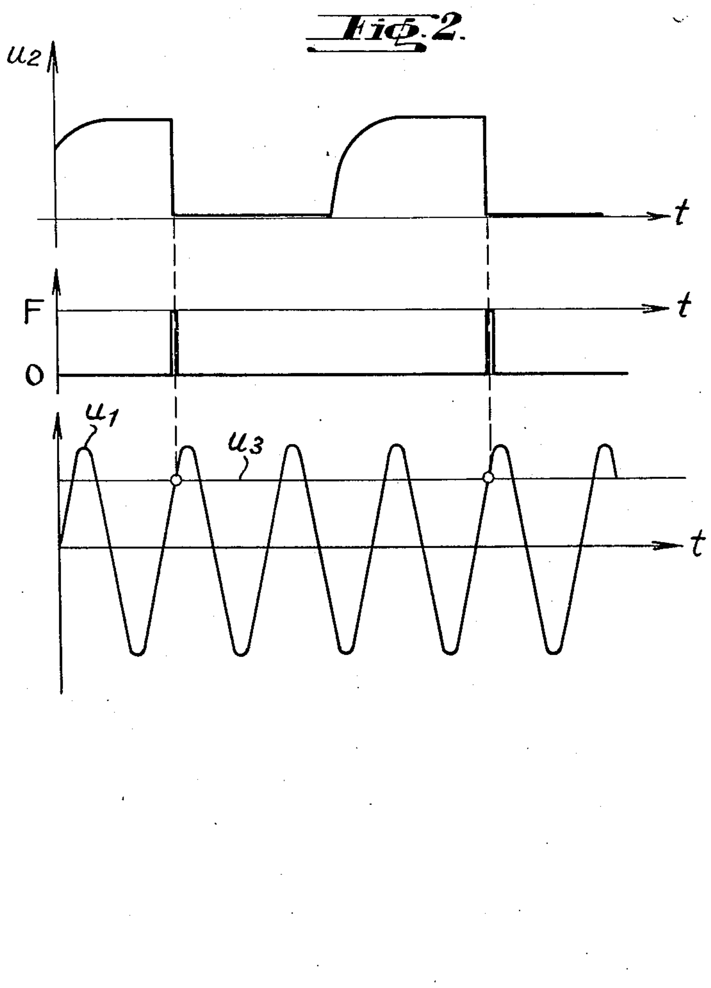
FIG. 2 is an explanatory diagram of the operation of the circuit shown in FIG. 1.

In the case of FIG. 2, the ratio *n* of the frequencies $F_1$ and $F_2$ is three.

The circuit permits of obtaining ratios *n* of several hundreds.

Figure 3:
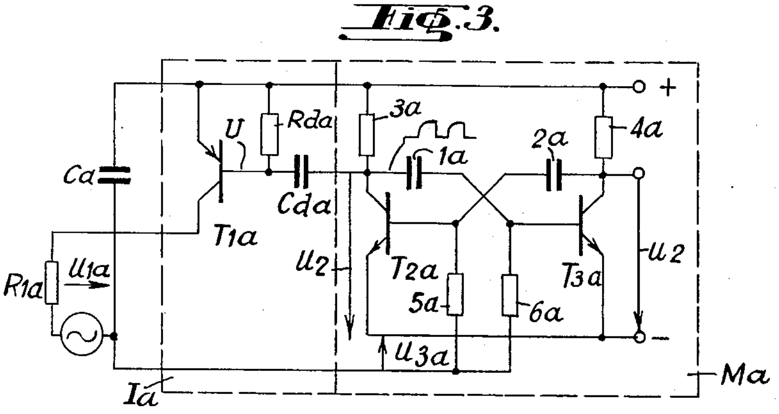
FIGS. 3 to 6 show in detail four different embodiments.

FIGURE 3 shows the detail diagram of a first embodiment.

The multivibrator M*a* comprises two transistors $T_{2a}$, $T_{3a}$, of the type NPN, interconnected between base and collector by condensers 1*a* and 2*a*. Their emitters are connected to the negative pole of a voltage source whereas the collectors are connected to the positive pole of the latter by two resistances 3*a*, 4*a*. The control voltage $u_{3a}$ is applied to the common point of the two resistances 5*a* and 6*a* the other ends of which are connected to the bases of the transistors $T_{2a}$ and $T_{3a}$.

From the theory of multivibrators it is known that the frequency of the latter may be varied by varying the voltage $u_{3a}$.

The circuit-breaker I*a* comprises a PNP type transistor $T_{1a}$ the base of which is connected to a circuit R*da*–C*da*, which permits of obtaining in the base of $T_{1a}$ current impulses which are the derivatives of the rectangular impulses created at the collector $T_{2a}$. The source of the input signal $u_{1a}$ is branched between a terminal of the condenser C*a* and the collector of $T_{1a}$, the other terminal of the condenser C*a* as well as the emitter of $T_{1a}$ being connected to the positive pole of said voltage source.

The circuit operates in the following manner:

The multivibrator M*a* creates rectangular impulses of which the repetition frequency depends upon the voltage $u_{3a}$. The circuit C*da*–R*da* produces a short current impulse at the base of the transistor $T_{1a}$ which, thus, becomes conducting and branches the source of the input signal $u_{1a}$ to the terminals of the condenser C*a* which charges at a voltage $u_3$ tending towards the instantaneous value of $u_{1a}$ at the moment of the impuse. This voltage $u_{3a}$, memorized until the apparition of the following differentiated impulse, is applied to the common point of the basic resistances of the transistors $T_{2a}$ and $T_{3a}$ and thus controls the frequency of the multivibrator.

In the following embodiments, the elements similar to those of FIG. 3 are designated (in order to shorten the description) by the same reference signs, no longer with the sign *a*, but the sign *b* for FIG. 4, *c* for FIG. 5 and *d* for FIG. 6.

Figure 4:
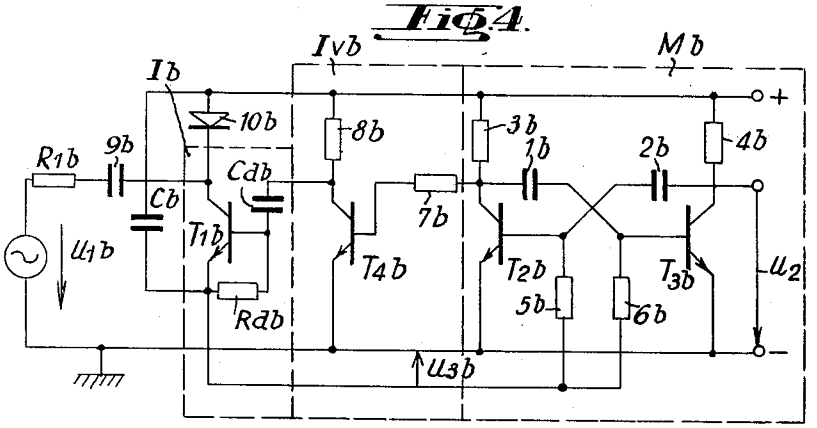

The circuit shown in FIG. 4 differs from the preceding one in that it only comprises transistors of a same type NPN. To this end, a current reverser I*v* consisting of a transistor $T_{4b}$ and of two resistances 7*b* and 8*b* is inserted between the multivibrator M*b* and the differentiation circuit C*db*–R*db* of the circuit-breaker I*b* of which the collector of the transistor $T_{1b}$ is fed through the agency of a diode 10*b*. The source of the input signal $u_{1b}$ is branched between the negative pole of the supply source, which constitutes a common earth, and a connecting condenser 9*b*. Independently of the use of transistors of a same type, this embodiment has the advantage of permitting the use of an input signal source $u_{1b}$ having a point which is earthed.

Figure 5:
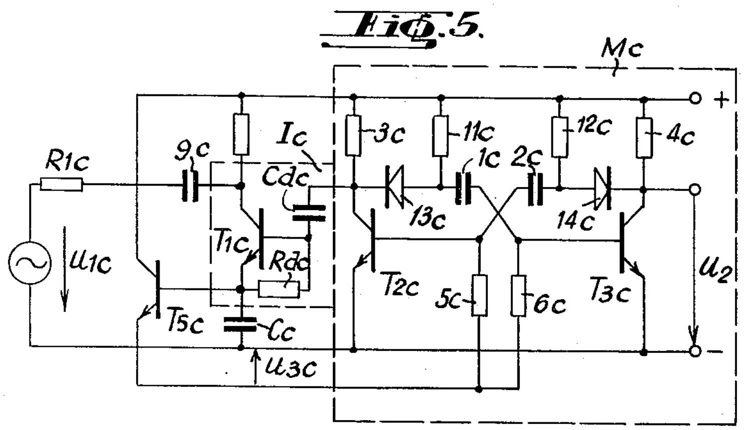

In the embodiment according to FIG. 5, one has inserted in the multivibrator M*c* two resistances 11*c* and 12*c* and two diodes 13c and 14c in order to stabilize the frequency thereof against variations of the feed voltage or of the temperature.

There modifications further permit of economizing the reverser transistor $T_{4b}$ of FIG. 4. On the other hand, the voltage at the terminals of the condenser Cc is applied to the multivibrator through the agency of an additional transistor $T_{5c}$ which permits of working with a source of $u_{1c}$ the internal resistance of which is high and a capacity Cc of low value.

Figure 6:
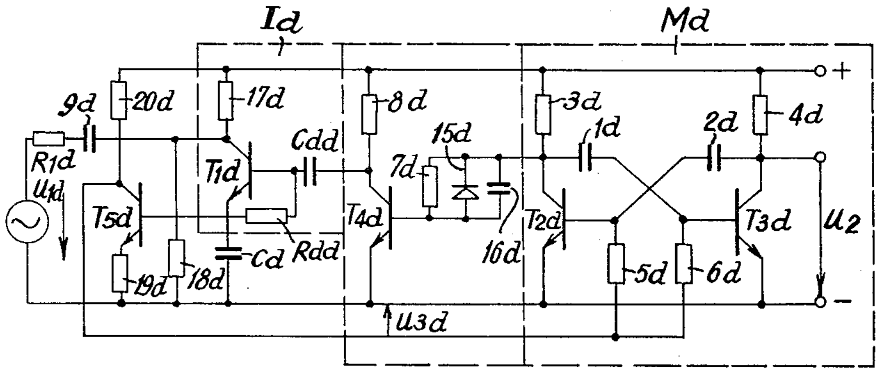

A fourth example is shown in FIG. 6. The base circuit of the reverser transistor $T_{4d}$ has been improved in order to obtain a steeper positive flanc signal at the collector and thus a more precise checking, necessary for a high input frequency. This improvement consists in attacking the base by a resistance 7d, a diode 15d and a capacity 16d in parallel.

The use of a common emitter amplifier stage T5d permits of working with a high internal resistance $R_{1d}$ of the source $u_{1d}$ and a low capacity 9d, with the advantage over the circuit of FIG. 5 of not lowering the average level of the control signal $u_{3d}$ (which is of great importance if the circuit must work with a low feed voltage). One realizes simultaneously a compensation for the effects of temperature variations and feed voltage.

The feed of the collector of the transistor $T_{1d}$ is effected by a voltage divider 17d, 18d, the feed of the transistor $T_{5d}$ being effected through two resistances 19d and 20d.

What I claim is:

1. A frequency dividing circuit comprising a source of periodic input signals, means for dividing the frequency of said periodic input signals, said dividing means comprising a semiconductor switch means, an unstable multivibrator, a condenser, means serially conductively connecting said source of periodic input signals to said semiconductor switch means, means serially conductively connecting said semiconductor switch means to said unstable multivibrator, means conductively connecting said condenser between said source of periodic input signals and said unstable multivibrator, means conductively connecting said condenser in parallel with said semiconductor switch means, a feedback path conductively connecting the output signal of said unstable multivibrator to said semiconductor switch means, means for periodically closing said feedback path in synchronism with said output signal from said unstable multivibrator in order to conductively connect said condenser to said source of periodic input signals through said semiconductor switch means whereby said condenser varies the frequency of said output signal under the control of a submultiple of the frequency to be divided.

References Cited

UNITED STATES PATENTS 2,866,104 12/1958 Biggam ------------ 307—255

JOHN S. HEYMAN, Primary Examiner

B. P. DAVIS, Assistant Examiner

U.S. Cl. X.R.

307—247, 291